(12) United States Patent
Gabriel

(10) Patent No.: US 8,658,892 B2
(45) Date of Patent: Feb. 25, 2014

(54) FERROELECTRIC FIELD COUPLING DEVICE FOR IMPROVED NOISE REDUCTION IN AC POWER LINES

(75) Inventor: Caelin Gabriel, Poulsbo, WA (US)

(73) Assignee: Gabriel Patent Technologies, LLC, Poulsbo, WA (US)

( * ) Notice: Subject to any disclaimer, the term of this patent is extended or adjusted under 35 U.S.C. 154(b) by 219 days.

(21) Appl. No.: 13/344,977

(22) Filed: Jan. 6, 2012

(65) Prior Publication Data
US 2012/0175163 A1    Jul. 12, 2012

Related U.S. Application Data

(60) Provisional application No. 61/430,500, filed on Jan. 6, 2011.

(51) Int. Cl.
*H01R 13/648* (2006.01)
(52) U.S. Cl.
USPC ............. 174/34; 17/33; 17/102 R; 333/12; 336/83

(58) Field of Classification Search
USPC ........ 174/360, 350, 363, 33, 34, 68.3, 102 R, 174/359, 36; 333/12, 181; 336/83, 221
See application file for complete search history.

(56) References Cited

U.S. PATENT DOCUMENTS

| | | | |
|---|---|---|---|
| 6,346,865 B1 * | 2/2002 | Callewaert et al. | 333/185 |
| 6,416,830 B2 * | 7/2002 | Yoshida et al. | 428/34.5 |
| 6,545,213 B1 * | 4/2003 | Gabriel | 174/36 |
| 7,915,987 B2 * | 3/2011 | Qu | 336/100 |
| 8,362,358 B2 * | 1/2013 | Hotte et al. | 174/9 F |
| 2008/0012674 A1 * | 1/2008 | Sano et al. | 336/83 |

* cited by examiner

*Primary Examiner* — Hoa C Nguyen
*Assistant Examiner* — Amol Patel
(74) *Attorney, Agent, or Firm* — Craig M. Stainbrook; Stainbrook & Stainbrook, LLP

(57) ABSTRACT

A method to increase the coupling effectiveness of an AC electric field to a ferroelectric substance, thereby improving noise reduction. The method employs an electric field chamber, preferably a hollow conductive tube, to distribute the radiated electric field over a larger effective area without affecting the inductance or transmission qualities of the AC power conductor.

12 Claims, 5 Drawing Sheets

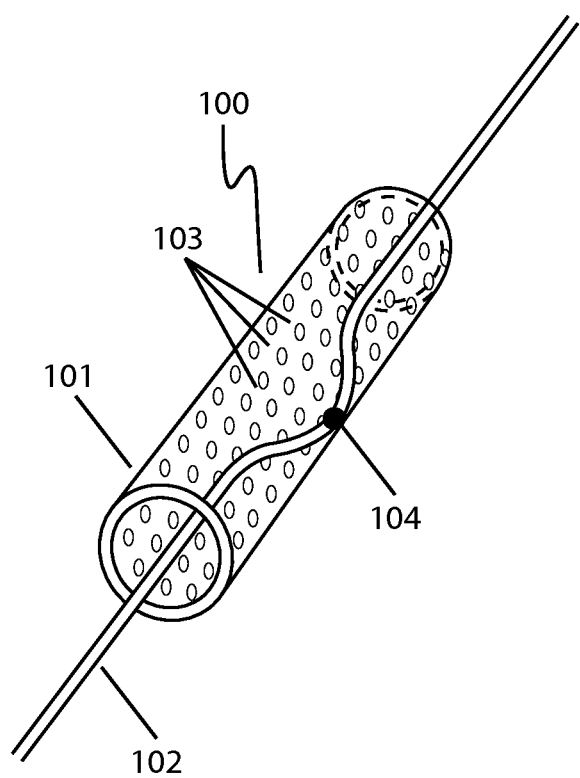
FIG._1

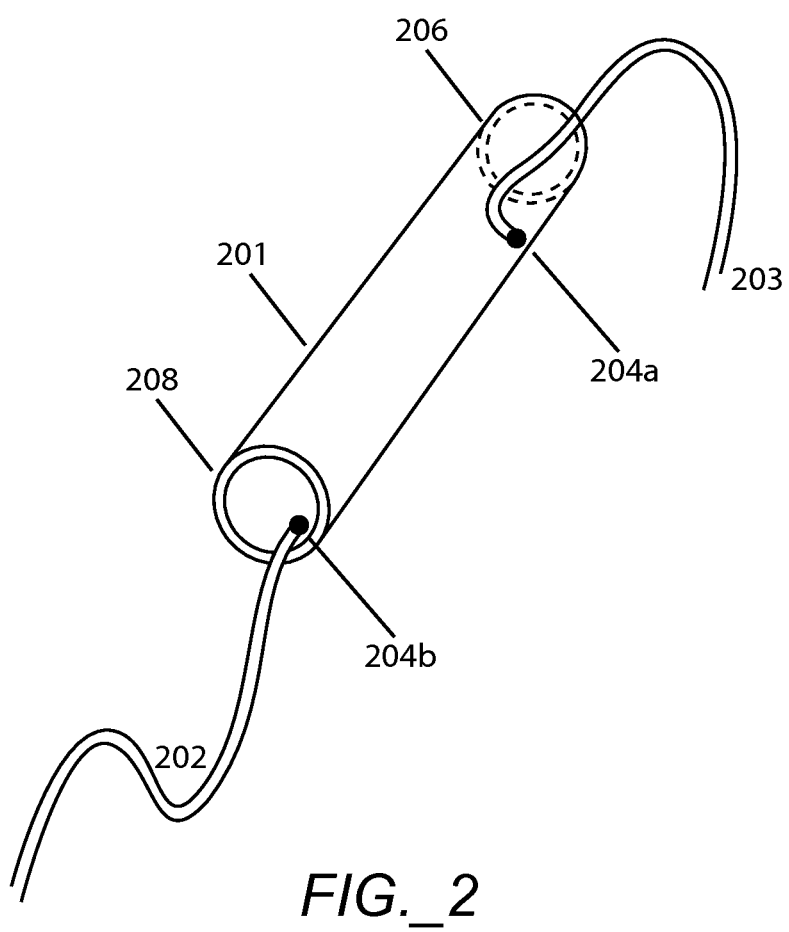
FIG._2

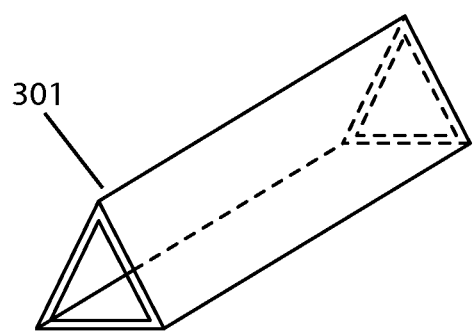
FIG._3A
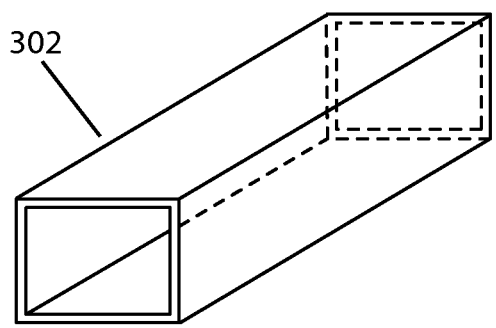
FIG._3B
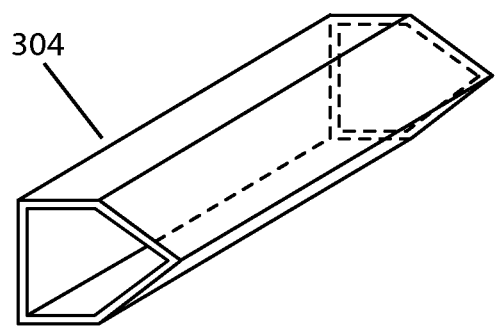
FIG._3C

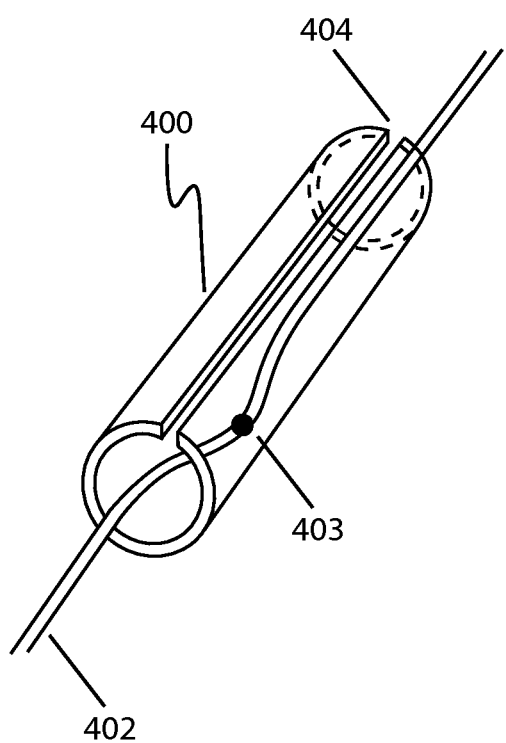
FIG._4

FERROELECTRIC FIELD COUPLING DEVICE FOR IMPROVED NOISE REDUCTION IN AC POWER LINES

CROSS REFERENCES TO RELATED APPLICATIONS

The present application claims the benefit of U.S. Provisional Patent Application Ser. No. 61/430,500, filed Jan. 6, 2011, (Jan. 6, 2011).

STATEMENT REGARDING FEDERALLY SPONSORED RESEARCH OR DEVELOPMENT

Not applicable.

THE NAMES OR PARTIES TO A JOINT RESEARCH AGREEMENT

Not applicable.

INCORPORATION-BY-REFERENCE OF MATERIAL SUBMITTED ON A COMPACT DISC

Not applicable.

BACKGROUND OF THE INVENTION

1. Field of the Invention

The present invention relates to AC cabling or power distribution units used for delivering AC power to an audio or video entertainment system or an audio or video recording system, and also to an electrical distribution system used for live music or video performances.

2. Background Discussion

AC power transmission is typically transmitted as a sine wave at a frequency of 50 or 60 hertz. Power lines are susceptible to EMI (electromagnetic interference) and RFI (radio frequency interference) due to the fact that power lines are relatively long and are generally not shielded. The EMI/RFI noise transmitted along with the power line frequency can interfere with the proper operation of electronic equipment. It is especially harmful to the sonic performance of high-end audio and video equipment. It is therefore desirable to substantially reduce or entirely eliminate EMI/RFI before it enters an electronic device.

There are many power conditioners and power strips designed to reduce the various forms of noise. The several fundamental design methodologies achieve this noise reduction, usually using filtering, isolation and/or absorption. Filtering methods include the use of inductive components, such as series coils, to limit the frequency bandwidth. Exemplary devices are low-pass filters. Another filtering method involves the use of capacitive components, such as power capacitors and by-pass capacitors, connected in parallel to the power line conductors. This device configuration creates a high-pass shunt. Inductive and capacitive methods are often used in conjunction to create filter networks such as L, T and pi filter networks.

Isolation methods involve the use of power transformers. These transformers are usually 1:1 power transformers, meaning that they neither step up nor step down applied voltage. The transformer has an electrostatic shield between the primary and secondary windings that prevents noise from passing from the primary to the secondary output.

Another common method to reduce power line noise involves the use of a ferrite material. Ferrite beads are commonly used to create a low pass filter, similar in function to a coil. However, a coil stores energy within its electromagnetic field and returns the energy to the conductor. In contrast, a ferrite material actually absorbs electromagnetic energy within its molecular structure and converts the energy to heat within that structure. Therefore, a ferromagnetic substance absorbs noise. Ferromagnetic materials are primarily composed of iron, which is commonly alloyed with other magnetic metals to create various frequency-specific ferrite materials.

All of these methods are used individually or in various combinations to create power conditioning products designed to reduce EMI/RFI. Each method has relative advantages, but all have corresponding negative effects when used for high-end audio or video systems. Inductive methods and isolation transformers tend to limit the transmission of instantaneous current, while capacitors tend to ring when excited by noise transients that are at their points of resonance, the latter problem requiring damping to bring stability to the circuit. Since ferrite beads usually operate in the megahertz to gigahertz frequency ranges, they do not limit instantaneous current delivery. However, audiophiles skilled at discerning subtle musical characteristics report that ferrite materials negatively impact the sound quality.

The last method of noise reduction involves the use of ferroelectric materials. A ferroelectric material is not composed of metal but rather non-conductive crystalline substances. These substances react at a molecular level when exposed to an electric field. They will tend to absorb electric field energy and convert it to heat within its structure, just as a ferromagnetic material absorbs magnetic field energy. Similar to ferromagnetic materials, ferroelectric materials operate primarily in the megahertz to gigahertz frequency ranges and are therefore effective in reducing EMI/RFI in these ranges. However, this method is not commonly used because it requires large amounts of material to achieve the same results obtainable with a small amount of ferromagnetic material. However, as reported by audiophiles that are skilled in the art, in the context of a high-end audio systems, ferroelectric materials, when used for power line noise reduction, tend to have superior sonic characteristics.

Gabriel U.S. Pat. No. 6,545,213 demonstrates the use of ferroelectric substances for the purpose of reducing high frequency noise that may be present on AC power transmission lines, as in a power cable or within a power conditioner. Gabriel '213 describes power wires contained within a non-conductive, flexible tube that is filled with a ferroelectric substance. As described in Gabriel '213 the effectiveness of the electric field coupling to the ferroelectric substance is largely determined by the diameter of the power wire within the non-conductive tube and the quantity of ferroelectric material used. [Gabriel '213 is incorporated in its entirety by reference herein.]

The present invention improves on the coupling of the electric field over Gabriel '213 by significantly increasing the contact area between the ferroelectric substance and the electric field chamber.

The foregoing reflects the current state of the art of which the present inventor is aware. Reference to, and discussion of, these patents is intended to aid in discharging Applicant's acknowledged duty of candor in disclosing information that may be relevant to the examination of claims to the present invention. However, it is respectfully submitted that the background art does not disclose, teach, suggest, show, or otherwise render obvious, either singly or when considered in combination, the invention described and claimed herein.

BRIEF SUMMARY OF THE INVENTION

The invention is an improved ferroelectric field coupling device. In a preferred embodiment, and its most essential aspect, the inventive apparatus comprises a hollow conductive tube fabricated from any of a number of suitable conductive metals, such as copper, aluminum, brass or any other conductive material. The size of the tube is larger than a typical power line wire, which it encompasses axially. Experimentation has shown that the ideal size of the tube ranges from 5 mm to 50 mm in diameter.

A power wire conductor passes axially through the center of the hollow conductive tube. The power wire is electrically bonded at only a single point within the tube. The wire may be connected at any point within the tube, but the preferred location is generally at a center point along the longitudinal length along the interior surface of the tube. The power wire should be insulated along its length within the tube so as to prevent contact with the tube at any point other than the desired contact point, but the insulation is removed at the electrically conductive contact point (a bonding point). When constructed in this manner, the hollow tube is not an actual conductor; rather, the tube defines a chamber that radiates an electromagnetic field within its hollow core. In the context of this invention, emphasis must be placed on the electric field component of the electromagnetic field. Therefore, the hollow tube may be considered and described as an electric field chamber.

The chamber is filled with an appropriate ferroelectric material, and each end of the two ends of the electrically conductive hollow tube are sealed to prevent the ferroelectric material from escaping while also providing for the entrance and exit of the power wire at the ends.

The completed assembly consists of an electric field chamber that has a ferroelectric substance sealed within the tube with a power wire passing axially through the chamber and connected at only a single bonding point within the chamber.

The chamber is not connected in series with the power wire as it should not to be used as part of the current path. A series connection would mean that the power wire is connected at one end of the hollow tube and a second power wire is connected at the other end of the hollow tube. This would make the hollow tube part of the current path and current would flow through the hollow tube. Such a configuration is undesirable because it may induce eddy currents within the hollow tube that could adversely affect the desired inductance or propagation of the AC current.

Since the contact area between the ferroelectric substance and the electric field chamber is significantly larger than the surface area of a typical wire, the corresponding electric field coupling to the ferroelectric substance is dramatically improved. To clarify the difference, a comparison may be made between two iterations using a ferroelectric substance. A first device in the comparison includes a 14 American Wire Gauge ("AWG") wire that passes through a non-conductive tube 50 mm in diameter and filled with a ferroelectric substance. This is similar to that described in Gabriel '213. The diameter of a 14 AWG wire is 1.628 mm with a circumference of 5.11 mm. If the length of the tube is 150 mm and the circumference of the wire is 5.11 mm, then the contact area of the wire to the ferroelectric substance is 766.5 mm.

The second device in the comparison is constructed according to the present invention. It includes a 14 AWG wire that passes through a 50 mm diameter copper tube that is 150 mm in length. The wire is connected at the inside center of the tube. The copper tube has a circumference of 157 mm giving the tube a contact area of 23,550 mm.

Both devices use the same amount of ferroelectric substance, but the present invention has a contact area 30 times greater than that of the first device. This greater contact area leads directly to a superior coupling of the electric field and the ferroelectric substance.

The following is a list of acceptable ferroelectric substances that may be used: Rochelle salts (potassium sodium tartrate), barium titanate, lead titanate, calcium titanate, lead zirconate and crystallized silicon dioxide in its various forms including: quartz, silica, fused silica and silica gel (desiccant). The invention is not limited to these substances as other ferroelectric materials may be used.

Other features characteristic of the invention, as to organization and method of operation, together with further objects and advantages thereof will be better understood from the following description considered in connection with the accompanying drawings, in which preferred embodiments of the invention are illustrated by way of example. It is to be expressly understood, however, that the drawings are for illustration and description only and are not intended as a definition of the limits of the invention. The various features of novelty that characterize the invention are pointed out with particularity in the claims annexed to and forming part of this disclosure. The invention does not reside in any one of these features taken alone, but rather in the particular combination of all of its structures for the functions specified.

It will be appreciated that the electric field chamber may be constructed in various manners which may include (but not limited to) hollow tubes that may be rectangular, triangular, oval, square, or irregular in shape.

Additionally, the electric field chamber may comprise a tube may split along its longitudinal length such that its cross-sectional view does not create a continuous form.

Finally, the electric field chamber may be constructed from a conductive plate or foil with the power wire attached to a single point on the plate and then enclosed within a non-conductive enclosure to contain the ferroelectric substance. This embodiment is generally undesirable due to the inefficiency of a plate as an electric field radiator, at least as compared to a hollow chamber and in view of the requirement for a non-conductive enclosure.

BRIEF DESCRIPTION OF THE SEVERAL VIEWS OF THE DRAWINGS

The invention will be better understood and objects other than those set forth above will become apparent when consideration is given to the following detailed description thereof. Such description makes reference to the annexed drawings wherein:

FIG. 1 is an upper perspective view of a first preferred embodiment of the ferroelectric field coupling device, having a hollow tube for an electric field chamber;

FIG. 2 is an upper perspective view showing an improper wiring configuration for the field coupling device;

FIGS. 3A-3C are each upper perspective views showing alternative tube shapes for the electric field chamber;

FIG. 4 shows the inventive field coupling device having an electric field chamber with a discontinuous cross-sectional profile.

DETAILED DESCRIPTION OF THE INVENTION

Figure 5:
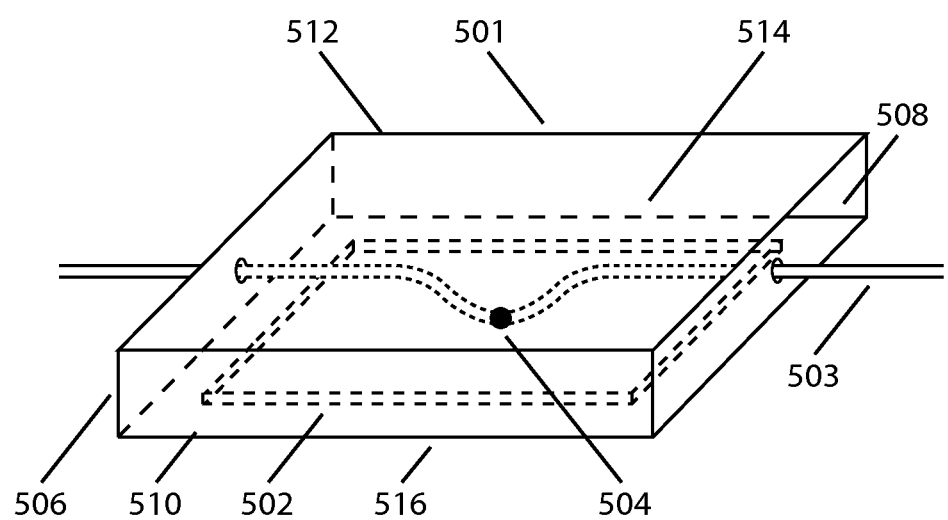
FIG. 5 is an upper perspective view showing the electric field chamber configured as a box surrounding a plate to which a wire conductor is bonded.

Referring to FIG. 1, there is shown a field coupling device 100 to improve ferroelectric coupling for noise reduction in AC power transmission. In this view, 102 is a typical power wire conductor with no dielectric material cover, or insulation. The wire passes axially through a hollow conductive tube 101. The wire conductor is electrically bonded to the tube at a bonding point 104. Note that there are no other connections to the wire along the length of the hollow tube. A ferroelectric material 103, preferably in granular or particulate form, fills the tube. The tube is sealed at both ends to contain the ferroelectric substance.

Referring next to FIG. 2, there is shown an example of how the device must not be configured. In this view, tube 201 is connected in series with power conductors. A first conductor 202 is electrically bonded at a bonding point 204a at a first end 206 of the tube, and a second wire 203 is electrically bonded at a second bonding point 204b at the other (second) end 208 of the tube. This places the tube in series with the power conductors and is part of the current path.

Referring next to FIGS. 3A-3C, there are shown alternative shapes for the hollow tube, which may be triangular in cross-section 301, square or rectangular in cross-section 302, or irregularly shaped 304 (polygonal or otherwise) in cross-section.

Turning now to FIG. 4, it will be seen that in an alternative embodiment 400, the tube may include a split 404 along its length. Otherwise, the power wire 402 is configured, positioned, and electrically bonded at a bonding point 403 as in the first preferred embodiment of FIG. 1.

Finally, and referring now to FIG. 5, in another alternative embodiment, a large and generally planar (flat) conductive plate 502 or foil may be substituted for the hollow tube. Like the tube the plate would be connected to the power wire 503 at only a single electrical bonding point 504 ensuring the current does not flow through the plate, but allowing the electric field to radiate throughout the plate. In this embodiment, the plate is disposed in an enclosure 501 (preferably a box) to contain the ferroelectric substance, which for purposes of clarity is not shown in this view. The plate is positioned within the ferroelectric material such that it does not come into contact with any of the sides 506, 508, 510, 512 of the enclosure and lies in a plane substantially normal to the sides and ends of the box and substantially parallel with the top and bottom sides 514, 516, respectively, of the box.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Therefore, the above description and illustrations should not be construed as limiting the scope of the invention, which is defined by the appended claims.

What is claimed as invention is:

1. A field coupling device, comprising:
   an electric field chamber;
   a ferroelectric substance sealed within said electric field chamber; and
   a power wire passing through the chamber and electrically connected to said electric field chamber at a single bonding point on the interior surface of said chamber.

2. The field coupling device of claim 1, wherein said electric field chamber is a hollow tube having a first end and a second end, and further including seals at each of said first and second end to retain said ferroelectric substance within said hollow tube.

3. The field coupling device of claim 2, wherein said tube is cylindrical and is generally round in cross-section.

4. The field coupling device of claim 2, wherein said hollow tube is polygonal.

5. The field coupling device of claim 4, wherein said hollow tube is triangular in cross-section.

6. The field coupling device of claim 4, wherein said hollow tube is rectangular in cross-section.

7. The field coupling device of claim 4, wherein said hollow tube is irregular in cross-section.

8. The field coupling device of claim 1, wherein said electric field chamber is elongate and said power wire is electrically bonded to a single point at a point substantially at the center of the longitudinal length of said electric field chamber.

9. A field coupling device, comprising:
   an enclosure;
   an electrically conductive plate disposed within said enclosure;
   a ferroelectric substance sealed within said enclosure and surrounding said plate; and
   a power wire passing through said enclosure and electrically connected to a single point to said plate within said enclosure.

10. The field coupling device of claim 9, wherein said enclosure is box-shaped and includes a generally planar top and bottom, and generally planar sides.

11. The field coupling device of claim 10, wherein said plate is planar.

12. The field coupling device of claim 11, wherein plate is oriented substantially normal to the sides and ends of said enclosure and substantially parallel to the top and bottom of said enclosure.

* * * * *